United States Patent
Wyatt et al.

(10) Patent No.: US 9,677,793 B2
(45) Date of Patent: Jun. 13, 2017

(54) MULTI MODE THERMAL MANAGEMENT SYSTEM AND METHODS

(75) Inventors: William G. Wyatt, Plano, TX (US); James A. Pruett, Allen, TX (US); Byron E. Short, Jr., Fairview, TX (US)

(73) Assignee: Raytheon Company, Waltham, MA (US)

( * ) Notice: Subject to any disclaimer, the term of this patent is extended or adjusted under 35 U.S.C. 154(b) by 501 days.

(21) Appl. No.: 13/245,524

(22) Filed: Sep. 26, 2011

(65) Prior Publication Data

US 2013/0074520 A1  Mar. 28, 2013

(51) Int. Cl.
*H01L 23/00* (2006.01)
*F25B 21/02* (2006.01)
*F28D 15/02* (2006.01)
*H01L 23/38* (2006.01)
*H01L 23/427* (2006.01)

(52) U.S. Cl.
CPC .......... *F25B 21/02* (2013.01); *F28D 15/0266* (2013.01); *H01L 23/38* (2013.01); *H01L 23/427* (2013.01); *H01L 2924/0002* (2013.01)

(58) Field of Classification Search
CPC ...... F28D 15/00; F28D 15/02; F28D 15/0266; F28D 15/0275; H01L 23/427; F28F 3/04
USPC .......................................... 62/3.1, 3.2, 259.2
See application file for complete search history.

(56) References Cited

U.S. PATENT DOCUMENTS

| | | | | |
|---|---|---|---|---|
| 4,049,051 | A * | 9/1977 | Parker | 165/166 |
| 5,413,167 | A * | 5/1995 | Hara et al. | 165/86 |
| 6,094,919 | A * | 8/2000 | Bhatia | 62/3.7 |
| 6,250,378 | B1 * | 6/2001 | Kobayashi | F28D 15/0266 165/104.33 |
| 6,695,041 | B2 * | 2/2004 | Lai et al. | 165/104.33 |
| 7,149,086 | B2 * | 12/2006 | Faneuf et al. | 361/699 |
| 7,227,753 | B2 | 6/2007 | Weber et al. | |
| 7,342,787 | B1 * | 3/2008 | Bhatia | 361/700 |
| 7,908,874 | B2 | 3/2011 | Weber et al. | |
| 2004/0165355 | A1 * | 8/2004 | Chen | 361/709 |
| 2004/0218367 | A1 * | 11/2004 | Lin et al. | 361/721 |
| 2005/0063158 | A1 * | 3/2005 | Thiele et al. | 361/700 |
| 2005/0219820 | A1 * | 10/2005 | Belady et al. | 361/700 |
| 2006/0144567 | A1 * | 7/2006 | Zhu et al. | 165/104.29 |
| 2008/0066891 | A1 * | 3/2008 | Jeng | 165/104.26 |
| 2008/0128117 | A1 | 6/2008 | Wyatt et al. | |
| 2009/0077981 | A1 | 3/2009 | Wyatt et al. | |
| 2009/0294117 | A1 * | 12/2009 | Hodes et al. | 165/287 |
| 2010/0050659 | A1 * | 3/2010 | Quisenberry et al. | 62/3.61 |
| 2011/0157828 | A1 | 6/2011 | Weber et al. | |
| 2012/0096871 | A1 * | 4/2012 | Wang et al. | 62/3.2 |

* cited by examiner

*Primary Examiner* — Orlando E Aviles Bosques
*Assistant Examiner* — Antonio R Febles

(57) ABSTRACT

A cooling structure includes a first plate, a second plate separated from the first plate, and an inlet adapted to receive a cooling fluid. The cooling structure also includes a first cooling portion coupled to the first plate and adapted to maintain a first temperature. The cooling structure further includes a second cooling portion coupled to the second plate and adapted to maintain a second temperature different from the first temperature.

21 Claims, 4 Drawing Sheets

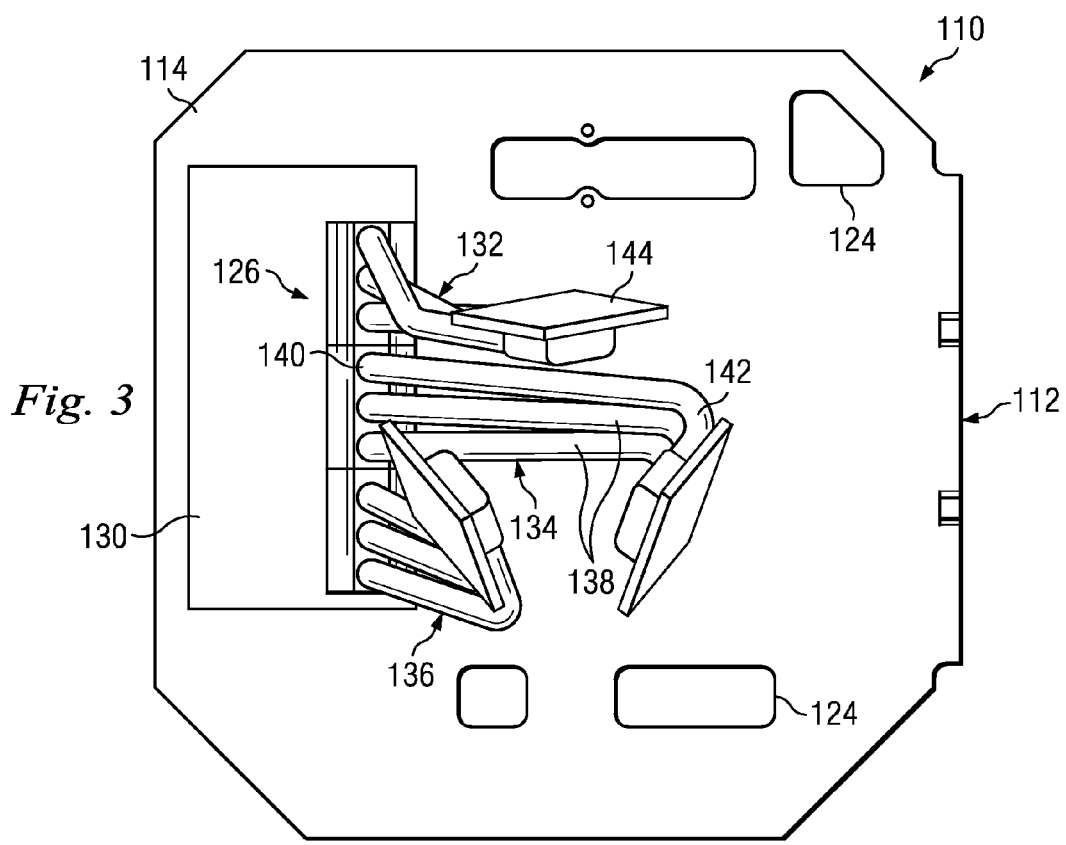
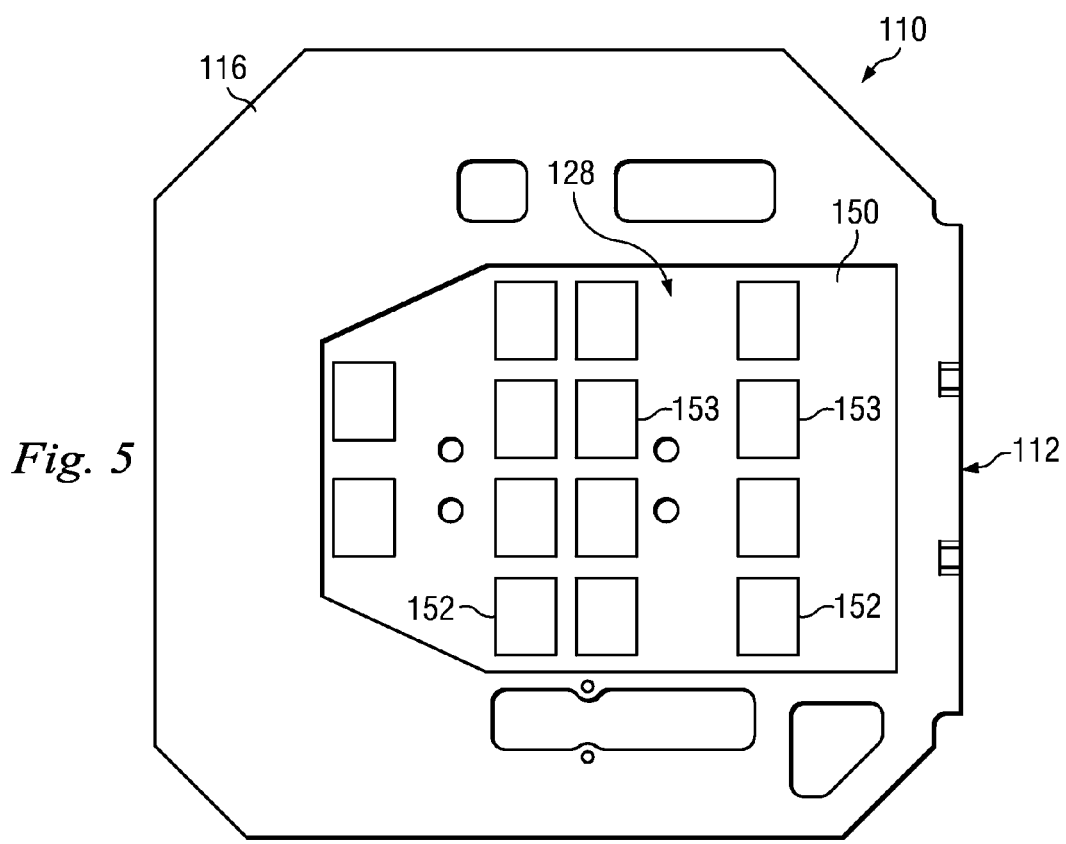

US 9,677,793 B2

MULTI MODE THERMAL MANAGEMENT SYSTEM AND METHODS

BACKGROUND

Some types of electronic circuits use relatively little power, and produce little heat. Circuits of this type can usually be cooled satisfactorily through a passive approach, such as convection cooling. In contrast, there are other circuits which consume large amounts of power, and produce large heat fluxes. One example is the circuitry used in a phased array antenna system. Others include other types of electronics, such as densely packed electronics used for current and future computational circuits, which can produce 1000-10,000 watts of heat per cubic centimeter, or more. In the modern phased array antenna example, the system can easily produce 25 to 500 kilowatts of heat, or even more. Coldplates are one option for cooling these types of heat producing systems. Currently available liquid cooled coldplates may operate using fluid delivered by an environmental control unit (ECU) which incorporates a compressor, an evaporator, a condenser, and control hardware. However, the use of ECU's may be precluded in applications where size, weight, and power consumption requirements are limited. For example, some vehicles may not support the size, weight, and power requirements associated with some ECU's, and therefore, these vehicles may be limited in the types of electronic components they may carry. Alternative systems and methods for removing high heat fluxes from electronic components are needed.

BRIEF DESCRIPTION OF THE DRAWINGS

The accompanying drawings illustrate embodiments of the devices and methods disclosed herein and together with the description, serve to explain the principles of the present disclosure.

FIG. 3 is a top view of the cooling apparatus of FIG. 2.

FIG. 5 is a bottom view of the cooling apparatus of FIG. 2.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting.

Figure 1:
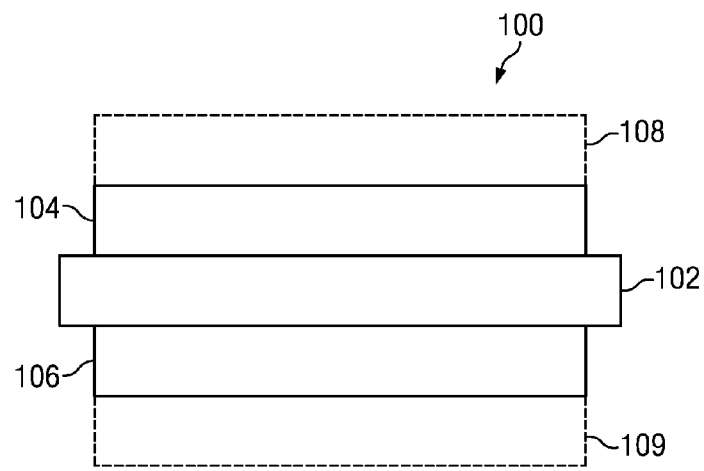
FIG. 1 is a schematic view of a cooling apparatus according to one embodiment of the disclosure.

FIG. 1 is a schematic view of a multi-mode cooling apparatus 100 for heat distribution and heat removal according to one embodiment of the disclosure. The cooling apparatus 100 generally includes a cooling structure 102, such as a coldplate platform through which a fluid flow may be directed. The cooling apparatus 100 also includes an upper cooling portion 104 and a lower cooling portion 106 coupled to the cooling structure 102. A heat producing system 108 may be mounted to the upper cooling portion 104 and a heat producing system 109 may be mounted to the lower cooling portion 106. The cooling portions 104, 106 remove heat from the heat producing systems 108, 109 and cool the systems to predetermined temperatures or maintain the systems within a predetermined range of temperatures. The predetermined temperatures or ranges of temperatures may be different for each heat producing system. Thus, the cooling portions 104, 106 may support different cooling requirements for different heat producing systems 108, 109. The cooling portions 104, 106 may also provide more cooling to the heat producing systems 108, 109 than may be provided by the fluid flow through the cooling structure 102 alone. In alternative embodiments, additional cooling portions may be coupled to the cooling structure 102 to transfer heat from additional heat producing systems.

The heat producing systems 108, 109 may be electronic assemblies including, for example, phased array radar antenna systems, laser systems, power drive systems, medical equipment, fuel cell components, computer systems, power converters, telecommunication systems, or other electronic or non-electronic systems capable of generating excessive heat that is incompatible with the long term efficient operation of the system. Radar transmit receive integrated microwave modules (TRIMMs), radio-frequency (RF), and digital components, are examples of components that may be particularly suited for use with the apparatus 100. These systems must be cooled to a temperature or to within a range of temperatures that allow the systems to operate safely and effectively. For some applications or missions, multiple heat producing systems are used in close proximity, for example on a single vehicle. When multiple heat producing systems are used in applications with size, weight, and power consumption limits, dedicated coldplates supported by a dedicated ECU's may be impractical.

With the integrated cooling apparatus 100 of FIG. 1, a common coldplate platform 102 supports multiple cooling portions 104, 106 allowing different heat producing systems 108, 109 to be cooled and maintained at the same or at different temperatures or ranges of temperatures. Thus, for cooling multiple heat producing systems, the cooling apparatus 100 may have reduced size, weight, and/or power consumption requirements as compared to a plurality of dedicated coldplates.

Figure 2:
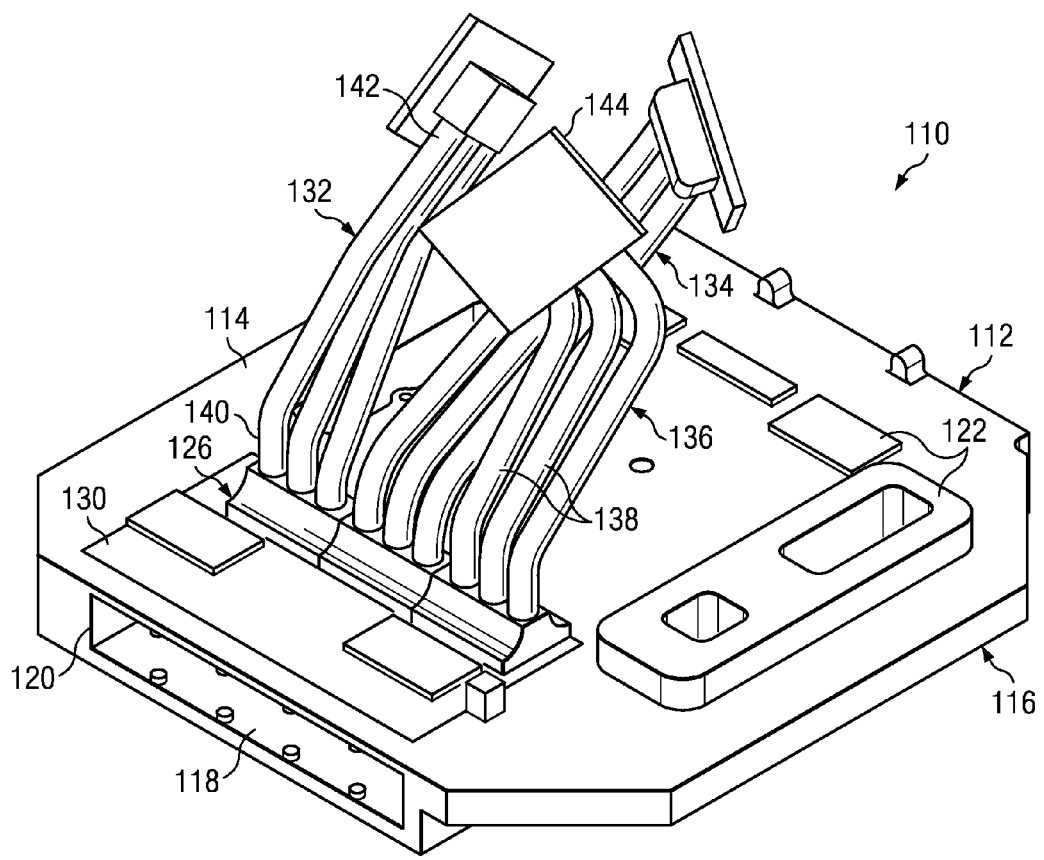
FIG. 2 is a top perspective view of a cooling apparatus according to another embodiment of the disclosure.

FIG. 2 is a top perspective view of a cooling apparatus 110 according to another embodiment of the disclosure. The cooling apparatus 110 includes a cooling structure 112 which may be, for example, a coldplate platform. The cooling structure 112 includes an upper plate 114 and a lower plate 116 separated by a passage 118. The cooling structure 112 also includes an inlet 120 sized and shaped to receive a fluid flow and an outlet (not shown) sized and shaped to pass the fluid flow from the structure 112. For example, the inlet 120 may have a rounded leading edge to reduce air flow pressure drop. The fluid flow may be a directed flow of coolant fluid. Suitable coolant fluids may include air or other gases at temperatures at, above, or below the ambient temperature. Suitable fluids may include liquids such as water, methanol, fluorinert, an ethylene glycol and water mixture (EGW), or other coolants at temperatures at, above, or below the ambient temperature. The cooling structure 112 may be formed by metal casting, milling, machining, vacuum-brazing, and/or other fabrication processes known in the art. The cooling structure may be formed from aluminum, copper, stainless steel, or another metals, ceramics, polymers, or combinations thereof capable of sustaining the temperature and structural loads associated with mounted heat producing systems. The cooling structure 112 may also include raised formations 122, through passages 124, or other structures that may be used for mounting the cooling apparatus 110 to a moving or stationary installation or for mounting other components to the cooling structure 112.

The cooling apparatus 110 includes an upper cooling portion 126 and a lower cooling portion 128 (see FIG. 4) coupled to the upper and lower plates 114, 116, respectively. In this embodiment, the upper cooling portion 126 includes a vapor chamber 130 and heat pipe assemblies 132, 134, 136. The vapor chamber 130 may be mounted to the upper surface of the upper plate 114, may be mounted in a recess formed in the upper plate, or may be mounted in an opening in the upper plate such that a lower face of the vapor chamber is in direct communication with the flow passage 118.

The heat pipe assemblies 132, 134, 136 each may include multiple heat pipes 138. For example in this embodiment, three heat pipes 138 may be used. Each heat pipe 138 includes a proximal end 140 coupled to the vapor chamber 130 and a distal end 142 coupled to a mounting portion 144. The heat pipes 138 may be angled, curved, straight, or in other complex configurations to position the mounting portions 144 at elevated, canted, and rotated orientations with respect to the upper plate 114. The heat pipes 138 may be flexible for adjustment in situ or may be relatively rigid. Heat producing systems (not shown), such as heat producing systems 108, 109 of FIG. 1, may be mounted to the mounting portions 144. A single heat producing system may be mounted to a single heat pipe assembly or to multiple heat pipe assemblies. The complex configurations of the heat pipe assemblies 132, 134, 136 allow the distal ends 142 of each heat pipe 138 to extend to and cool multiple heat producing systems, such as TRIMMs for example, in different spaced apart locations while the proximal ends 140 are coupled to a common platform, namely, the common vapor chamber 130. The elongated heat pipe assemblies 138 may also allow heat from the heat producing systems to be transferred to the portion of the cooling structure 112 nearest the inlet 120 where the flowing fluid has the lowest temperature.

Each heat pipe 138 is a two-phase passive heat transfer device that transfers heat received from the mounting portion 144 and the mounted heat producing system to the vapor chamber 130 and the cooling structure 112. The vapor chamber 130 is a relatively thin two-phase passive heat spreader that spreads the heat received from the heat pipes 138 away from the heat pipes. The heat is also transferred through the vapor chamber 130 toward the passage 118 where it is removed by the flowing cooling fluid.

As a non-limiting example of operation, when a heat producing system mounted to the mounting portion 144 operates, thermal energy from the heat producing system is transferred to a heat pipe 138, causing a fluid in the heat pipe 138 to evaporate. Upon evaporation, the fluid in the heat pipe 138 migrates from the distal end 142 of the heat pipe towards the proximal end 140 of the heat pipe, for example, in the form of vapor. The thermal energy contained in the fluid traveling through the heat pipe 138 is transferred to the vapor chamber 130. Upon release of the thermal energy, the condensed fluid in the heat pipe 138 may migrate back toward the distal end 142. The thermal energy received at the upper surface of the vapor chamber causes a fluid in the vapor chamber to evaporate. Upon evaporation, the fluid in the vapor chamber migrates away from the heat pipes 138 toward the flow passage 118, for example, in the form of vapor. The thermal energy contained in the fluid traveling through the vapor chamber 130 is transferred to the cooling fluid flowing through the flow passage 118.

Figure 4:
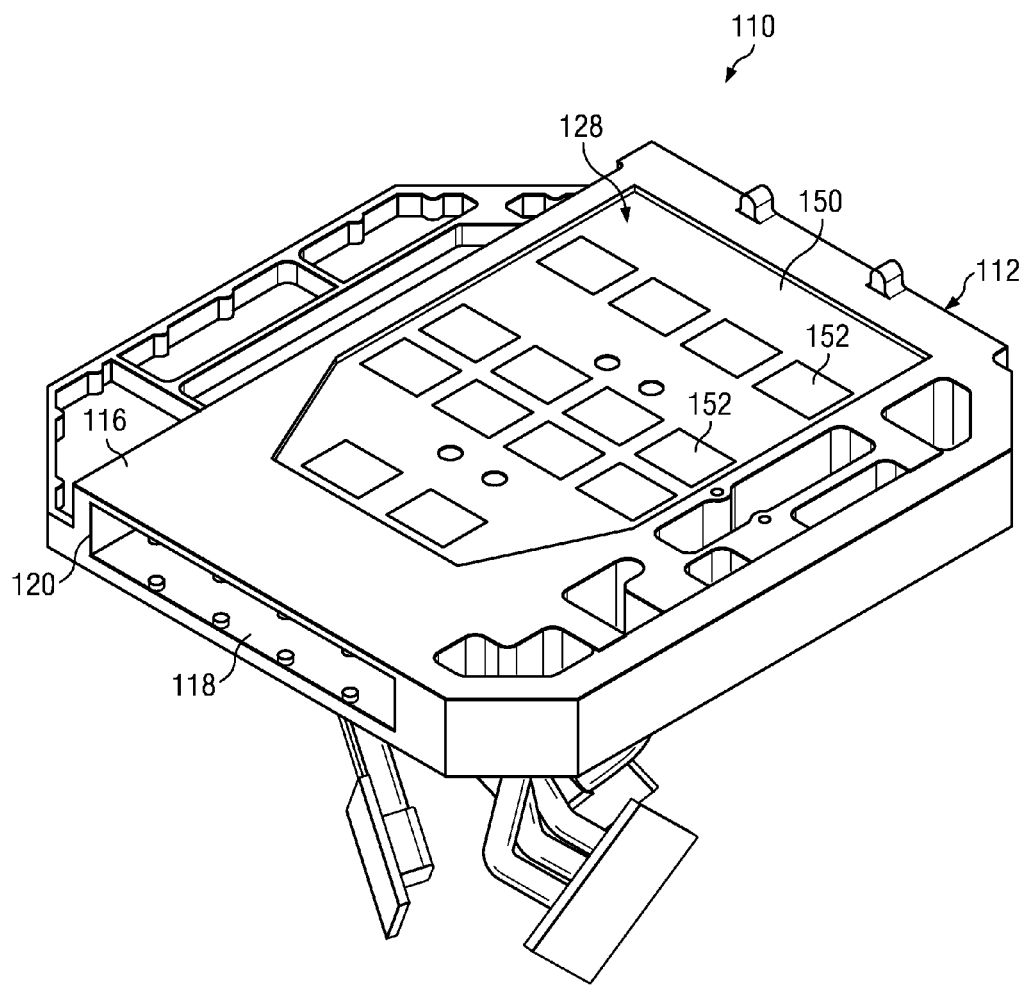
FIG. 4 is a bottom perspective view of the cooling apparatus of FIG. 2.

FIG. 4 is a bottom perspective view of the cooling apparatus of FIG. 2. In this embodiment, the lower cooling portion 128 includes a vapor chamber 150 and a plurality of thermo-electric cooling (TEC) elements 152. The vapor chamber 150 may be mounted to the surface of the lower plate 116, may be mounted in a recess formed in the lower plate, or may be mounted in an opening in the lower plate such that an upper face of the vapor chamber is in direct communication with the flow passage 118. The TEC elements 152 are active solid-state devices that use the Peltier effect to pump heat from one side of the device to another side of the device when an electric current is applied. The TEC elements 152 may be mounted to the vapor chamber 150 with mechanical fasteners, adhesives, or other known coupling systems. For example the TEC elements may be mounted with phase change interface material on both the hot and cold sides of the TECs. The interface material on the hot side of the TECs may have a phase change on both sides. The interface material on the cold side of the TECs may have phase change material on the side next to the TECs. The interface material may reduce the thermal contact resistance and also a moderate bond to attach the TECs to the vapor chamber. The vapor chamber 150 may serve to distribute the localized heat from the TEC elements 152 over a larger area of the lower plate 116. The surfaces 153 of the TEC elements may form mounting portions for mounting heat producing systems. In this embodiment, one or more heat producing systems (not shown), such as heat producing systems 108, 109 of FIG. 1, may be mounted to the TEC elements 152. Suitable components for mounting to the TEC may include any of the components listed above, including for example, radio-frequency (RF) and digital components. Although not shown, the cooling apparatus 110 may include power and control systems to provide power and control to the TEC elements 152. In one example, the approximately fourteen TECs may be used, with each dissipating approximately 18 W.

In general, TEC elements (also sometimes referred to as a Peltier devices) use electrical energy to transfer thermal energy from one side of the TEC to the other side of the TEC. As an example, in one configuration, a TEC may have a first plate and a second plate with bismuth telluride disposed therebetween. Upon applying a current to the TEC in one direction, the first plate becomes cool while the second plate becomes hot. This is due to the electrical energy causing the thermal energy to be transferred from the first plate to the second plate. Upon applying the current to the same TEC in the opposite direction, the second plate becomes cool while the first plate becomes hot. Thus, TECs can be used to either remove thermal energy from one plate or add thermal energy to same one plate. There are a variety of manufactures of thermoelectric devices, including, but not limited to, Marlow Industries, Inc. of Dallas, Tex. and Melcor of Trenton, N.J.

As a non-limiting example of operation, when a heat producing system mounted to the TEC elements 152 operates, thermal energy from the heat producing system is transferred to the TEC elements 152. The TEC elements 152 move the thermal energy away from the mounted heat producing systems toward the vapor chamber 150. The thermal energy received at the surface of the vapor chamber 150 causes a fluid in the vapor chamber to evaporate. Upon evaporation, the fluid in the vapor chamber 150 migrates away from the TEC elements 152 toward the flow passage 118, for example, in the form of vapor. The thermal energy contained in the fluid traveling through the vapor chamber 150 is transferred to the cooling fluid flowing through the flow passage 118.

The separately operating upper and lower cooling portions 126, 128 allow a common cooling apparatus 110 to cool at least two different heat producing systems to two different temperatures or two different ranges of temperatures. In alternative embodiments, more than two cooling portions with the same or with different heat transfer mechanisms may be used with a common coldplate to cool multiple heat producing systems.

Figure 6:
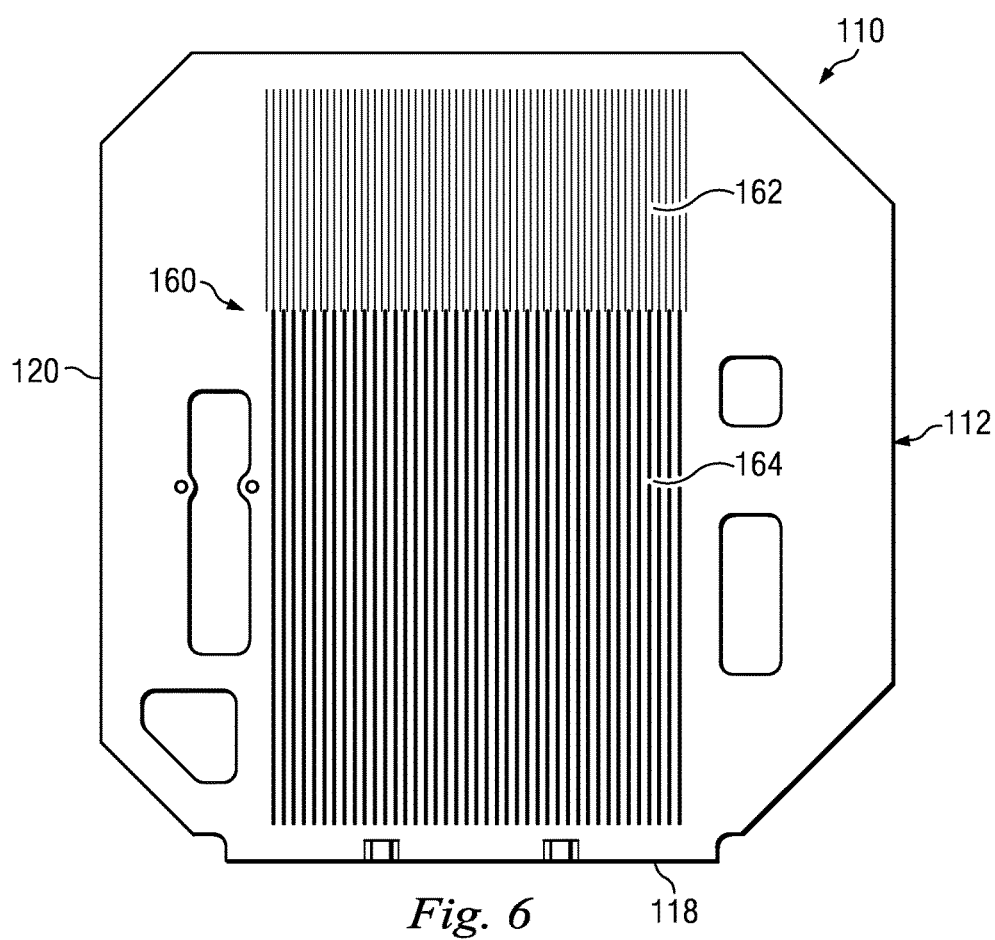
FIG. 6 is an interior view of the cooling apparatus of FIG. 2.

FIG. 6 is a view of the cooling apparatus of FIG. 2 that illustrates the interior of the cooling structure 112. Between upper and lower plates 114, 116, a heat sink 160 serves to transfer heat received from the vapor chambers 130, 150 to the cooling fluid flowing through the passage 118. The heat sink 160 increases the surface area in contact with the flowing cooling fluid to dissipate the heat received from the vapor chambers 130, 150. In this embodiment, the heat sink 160 is a fin structure that includes a high density finstock material 162 and a lower density finstock material 164. The finstock materials 162, 164 may be lanced, offset, wavy, ruffled, round crest, flat crest, or any other configuration that promotes effective heat dissipation. The finstock material may be bonded, brazed, or otherwise affixed to one or both of the plates 114, 116. The higher density finstock material 162 may be generally located below the heat pipe assemblies 132, 134, 136 and the vapor chamber 130 to accommodate the high flux from the heat pipe assemblies. This is also the area nearest the inlet 120 where the cooling fluid may have the lowest temperature. The area of the flow passage 118 generally above the TEC elements 152 and the vapor chamber 150 may experience lower heat flux. In this area, the lower density finstock material 164 may reduce the pressure drop and therefore increase cooling fluid flow. Pin fins are another type of fin structure that may be used for transferring heat into the cooling fluid. The pin fins may be circular, oval, elliptical, square, diamond, triangular, or another cross-sectional shape.

The combined use of the fluid cooled cooling structure 112 with the upper and lower cooling portions 126, 128 may allow multiple heat producing systems to be cooled with a less expensive coolant fluid, such as air at ambient temperature, thus reducing the reliance on large, heavy, expensive, high power consuming ECU's to provide cooler fluids. The use of upper and lower cooling portions 126, 128 may permit the cooling apparatus 110 to maintain different temperatures at the mounting portions 153 of the TEC elements 152 and the mounting portions 144. For example, in one embodiment, the mounting portions 153 of the TEC elements 152 may maintain a temperature of approximately 50° C. while the side of the TEC elements interfacing with the vapor chamber 150 are maintained at approximately 70° C. Heat loads of, for example, 247 W may be applied to the upper cooling portion, and heat load of, for example, 256 W may be applied to the lower cooling portion. In the same embodiment, the mounting portions 144 of the heat pipe assemblies 132, 134, 136 may maintain a temperature of approximately 70° C. while the ambient cooling air at the inlet 120 of the passage 118 may be approximately 56° C. These examples are not intended to be limiting as the apparatus can accommodate many different temperature scenarios.

In alternative embodiments, heat pipe assemblies may include fewer or more heat pipes. In other alternative embodiments, TEC elements may be omitted and heat producing systems mounted directly to vapor chamber. In other alternative embodiments, the number and the arrangement of the TEC elements may be varied, for example, to accommodate the size, shape, or heat flux of a particular heat producing element. In other alternative embodiments, the TEC elements may be directly mounted to the lower plate of the cooling structure, without use of an intermediary vapor chamber. In other alternative embodiments, the cooling structure may be omitted with the heat pipe assemblies and the TEC element mounted to a common or to different vapor chambers. In other alternative embodiments, conductive elements such as solid copper or aluminum bars, may be substituted for the heat pipes 138.

Figure 7:
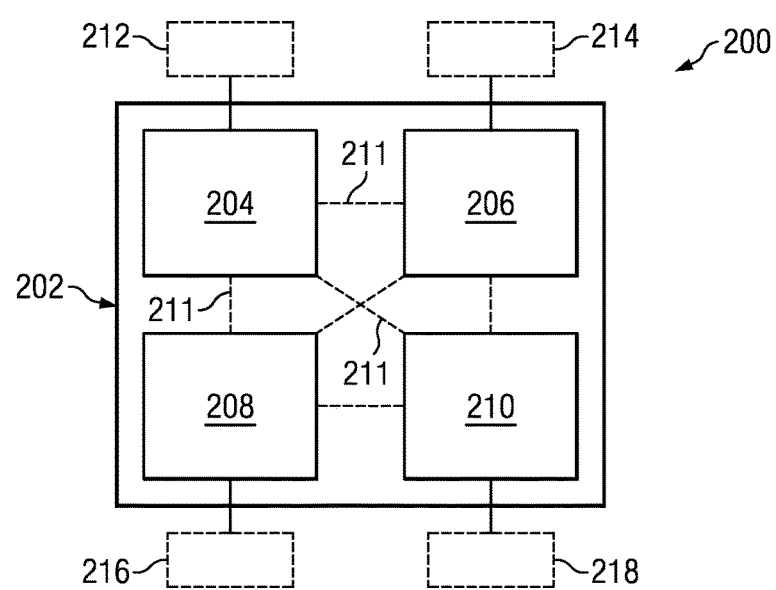
FIG. 7 is a schematic view of a cooling apparatus according to another embodiment of the disclosure.

FIG. 7 is a schematic view of a multi-mode cooling apparatus 200 for heat distribution and heat removal according to another embodiment of the disclosure. The cooling apparatus 200 generally includes a cooling structure 202, such as a coldplate platform through which a fluid flow may be directed. The cooling apparatus 200 also includes cooling portions 204, 206, 208, 210. The cooling portion 204 may be one or more heat pipe assemblies as previously described. The cooling portion 206 may be one or more vapor chambers as previously described. The cooling portion 208 may be one or more TEC elements as previously described. The cooling portion 210 may be a liquid coolant loop. Heat producing systems 212, 214, 216, 218 may be directly and/or thermally coupled to the cooling portions 204, 206, 208, 210, respectively. The lines 211 are to indicate that any of the cooling portions 204, 206, 208, 210 may be thermally coupled to any of the other cooling portions to transfer heat collected from any of the heat producing systems 212, 214, 216, 218 to one or more of the cooling portions before being transferred to the cooling structure 202. For example, the liquid coolant loop 210 may circulate cooling fluid to one or more of the heat producing systems 212, 214, 216, 218 and return the heat from those systems either directing to the cooling structure 202 or to one of the other cooling portions such as the TEC elements 208. When the liquid coolant loop 210 transfers heat to an active cooling portion such as the TEC elements, the temperature of the liquid flowing in the liquid coolant loop may be reduced to below ambient temperature.

The foregoing outlines features of selected embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. It is understood that all spatial references, such as "upper," "lower," "above," and "below" are for illustrative purposes only and can be varied within the scope of the disclosure. Those skilled in the art should also realize that such equivalent constructions do not depart from the spirit and scope of the present disclosure, and that they may make various changes, substitutions, and alterations herein without departing from the spirit and scope of the present disclosure, as defined by the claims that follow.

What is claimed is:
1. An apparatus comprising:
 a cooling structure including a first plate, a second plate separated from the first plate, and a passage between the first and second plates, the passage configured to receive a first cooling fluid and direct the received first cooling fluid in a first direction;

a first cooling portion coupled to the first plate and adapted to maintain a first temperature, the first cooling portion comprising:
  a first vapor chamber heat spreader containing a second cooling fluid and comprising a lower surface mounted in or on the first plate and an upper surface that is opposite the lower surface and configured to receive thermal energy, wherein the first vapor chamber heat spreader is configured to enable the second cooling fluid to migrate therethrough in a second direction away from the upper surface and toward the passage to spread the thermal energy toward the lower surface; and
  a plurality of heat pipes containing a third cooling fluid, wherein a first end of each heat pipe is coupled to the first vapor chamber heat spreader at the upper surface of the first vapor chamber heat spreader; and
a second cooling portion coupled to the second plate and adapted to maintain a second temperature different from the first temperature.

2. The apparatus of claim 1, wherein the first end of each heat pipe is coupled to the first vapor chamber heat spreader along a line that is not parallel to the first and second directions.

3. The apparatus of claim 1, wherein:
the heat pipes are grouped into a plurality of heat pipe assemblies, each heat pipe assembly comprising a subset of the heat pipes; and
a second end of each heat pipe is coupled to one of multiple mounting interfaces, the heat pipes in each heat pipe assembly coupled to a same one of the mounting interfaces, each heat pipe assembly associated with a different one of the mounting interfaces.

4. The apparatus of claim 1, wherein a first portion of the plurality of heat pipes is angled in a different direction from a second portion of the plurality of heat pipes.

5. The apparatus of claim 1, wherein the second cooling fluid in the first vapor chamber heat spreader is configured to receive thermal energy from the third cooling fluid in the heat pipes.

6. The apparatus of claim 1, wherein the second cooling portion includes a second vapor chamber heat spreader.

7. The apparatus of claim 1, wherein the second cooling portion includes one or more thermo-electric coolers.

8. The apparatus of claim 7, wherein the second cooling portion further includes a second vapor chamber heat spreader extending between the one or more thermo-electric coolers and the second plate.

9. The apparatus of claim 8, wherein the first vapor chamber heat spreader is thermally coupled to the second vapor chamber heat spreader.

10. The apparatus of claim 7, wherein:
the cooling structure includes a fin structure disposed between the first and second plates; and
the fin structure has a first density in a first region of the cooling structure proximal to the one or more thermo-electric coolers and a second density in a second region of the cooling structure distal of the one or more thermo-electric coolers.

11. The apparatus of claim 1, wherein the first cooling fluid comprises air.

12. A method comprising:
directing a first cooling fluid through a cooling structure, wherein the cooling structure includes a flow passage that directs the cooling fluid in a first direction, the flow passage extending between first and second separated plates;
cooling a first mounting interface of a first cooling portion to a first temperature, the first cooling portion comprising:
  a first vapor chamber heat spreader containing a second cooling fluid and comprising a lower surface mounted in or on the first plate and an upper surface that is opposite the lower surface and configured to receive thermal energy, wherein the first vapor chamber heat spreader is configured to enable the second cooling fluid to migrate therethrough in a second direction away from the upper surface and toward the passage to spread the thermal energy toward the lower surface; and
  a plurality of heat pipes coupled to the first mounting interface, the heat pipes containing a third cooling fluid, wherein a first end of each heat pipe is coupled to the first vapor chamber heat spreader at the upper surface of the first vapor chamber heat spreader; and
cooling a second mounting interface of a second cooling portion to a second temperature, the second cooling portion coupled to the second plate, wherein the first temperature is different from the second temperature.

13. The method of claim 12, further comprising:
transmitting thermal energy through the first end of each heat pipe coupled to the first vapor chamber heat spreader.

14. The method of claim 12, wherein:
the first mounting interface comprises multiple first mounting interfaces;
the heat pipes are grouped into a plurality of heat pipe assemblies, each heat pipe assembly comprising a subset of the heat pipes; and
a second end of each heat pipe is coupled to one of the first mounting interfaces, the heat pipes in each heat pipe assembly coupled to a same one of the first mounting interfaces, each heat pipe assembly associated with a different one of the first mounting interfaces.

15. The method of claim 12, wherein cooling the first mounting interface includes operating at least one of the heat pipes to remove heat from the first mounting interface.

16. The method of claim 12, further comprising:
transmitting thermal energy from the third cooling fluid in the heat pipes to the second cooling fluid in the first vapor chamber heat spreader.

17. The method of claim 12, wherein cooling the second mounting interface includes operating a second vapor chamber heat spreader to remove heat from the second mounting interface.

18. The method of claim 12, wherein cooling the second mounting interface includes operating at least one thermo-electric cooler to remove heat from the second mounting interface.

19. The method of claim 18, wherein the first vapor chamber heat spreader is thermally coupled to a second vapor chamber heat spreader that is coupled to the at least one thermo-electric cooler.

20. The method of claim 12, wherein the first mounting interface includes a first mounting surface and a second mounting surface arranged at different angles with respect to the first plate.

21. An apparatus comprising:
a cooling structure including a first plate, a second plate separated from the first plate, and a passage between the first and second plates, the passage configured to transport a first cooling fluid between the first and second plates and direct the first cooling fluid in a first direction;

a first cooling portion coupled to the first plate and configured to maintain a first temperature, the first cooling portion comprising:
  a first vapor chamber heat spreader containing a second cooling fluid and comprising a lower surface mounted in or on the first plate and an upper surface that is opposite the lower surface and configured to receive thermal energy, wherein the first vapor chamber heat spreader is configured to enable the second cooling fluid to migrate therethrough in a second direction away from the upper surface and toward the passage to spread the thermal energy toward the lower surface; and
  a plurality of heat pipes containing a third cooling fluid; and
a second cooling portion coupled to the second plate and configured to maintain a second temperature different from the first temperature;
wherein the heat pipes are configured to (i) transfer heat from a heat generating source to the third cooling fluid and provide evaporated third cooling fluid to the first vapor chamber heat spreader in vapor form and (ii) receive the third cooling fluid in condensed form from the first vapor chamber heat spreader;
wherein each of the heat pipes comprises a proximal end coupled to the first vapor chamber heat spreader at the upper surface of the first vapor chamber heat spreader and a distal end coupled to the heat generating source; and
wherein the first vapor chamber heat spreader is configured to (i) transfer heat from the evaporated third cooling fluid to the second cooling fluid and provide the third cooling fluid in condensed form to the heat pipes and (ii) release heat from the second cooling fluid in vapor form to the first cooling fluid in the passage.

\* \* \* \* \*